United States Patent [19]

Dahlberg

[11] 4,317,091
[45] Feb. 23, 1982

[54] NEGATIVE SEMICONDUCTOR RESISTANCE

[75] Inventor: Reinhard Dahlberg, Flein, Fed. Rep. of Germany

[73] Assignee: Licentia Patent-Verwaltungs-G.m.b.H., Frankfurt am Main, Fed. Rep. of Germany

[21] Appl. No.: 153,938

[22] Filed: May 28, 1980

[30] Foreign Application Priority Data

Jul. 3, 1979 [DE] Fed. Rep. of Germany ....... 2926757

[51] Int. Cl.$^3$ .............................................. H01L 45/00
[52] U.S. Cl. .................................... 331/107 R; 357/1; 357/9; 357/13; 357/55; 357/57
[58] Field of Search ...................... 357/1, 9, 13, 55, 56, 357/57, 79; 331/107 R

[56] References Cited

U.S. PATENT DOCUMENTS

| | | |
|---|---|---|
| 2,728,034 | 12/1955 | Kurshan . |
| 3,451,126 | 6/1969 | Yamamoto ............................... 357/2 |
| 3,745,427 | 7/1973 | Hilsum et al. ........................... 357/1 |
| 4,185,253 | 1/1980 | Lade ............................... 331/107 R |
| 4,187,513 | 2/1980 | Spellman ................................. 357/1 |

FOREIGN PATENT DOCUMENTS

| | | |
|---|---|---|
| 1108813 | 10/1959 | Fed. Rep. of Germany . |
| 2002810 | 9/1970 | Fed. Rep. of Germany . |
| 2547262 | 4/1977 | Fed. Rep. of Germany . |

Primary Examiner—William D. Larkins
Attorney, Agent, or Firm—Spencer & Kaye

[57] ABSTRACT

A negative semiconductor resistance comprises two separate semiconductor elements of the same conductivity characteristic and with at least three areas of contact of a diameter less than $1.10^{-2}$ cm, a voltage being applied to the semiconductor elements such that it generates an electrical field which is greater than the breakdown field strength at the contact areas.

12 Claims, 4 Drawing Figures

NEGATIVE SEMICONDUCTOR RESISTANCE

BACKGROUND OF THE INVENTION

The invention relates to a component having a negative differential resistance which arises if the breakdown field strength in a semiconductor is exceeded.

Negative differential resistances have been known for a long time in semiconductors and result from avalanche-type carrier multiplication by means of collision or impact or field ionisation e.g. in the thyristor or tunnel diode. When applying a sufficiently high voltage to a homogenous semiconductor element, a negative current/voltage chartacteristic is also formed in the breakdown region. These breakdown phenomena are generally also connected however with avalanche type rises in temperature with the formation of pinched current paths and with the destruction of the semiconductor sample.

SUMMARY OF THE INVENTION it is an object of the invention to provide a component in which the breakdown which causes a negative branch in the current/voltage characteristic, takes place without substantial heating of the semiconductor.

According to the invention, there is provided a negative semiconductor resistance comprising two separate semiconductor elements of the same conductivity characteristics and defining between them at least three fixed areas of contact with a diameter of less than $1.10^{-2}$ cm and means for applying a voltage to said two separate semiconductor elements to provide an electrical field strength greater than the breakdown field strength at said areas of contact.

Further according to the invention there is provided a negative semiconductor resistance in which two separate semiconductor elements are provided having the same conductivity characteristics; both semiconductor elements have at least three fixed areas of contact (3), with a diameter of less than $1.10^{-2}$ under mechanical pressure; and an electrical d.c. or a.c. voltage is applied to the two separate semiconductor elements and is so high that an electrical field strength greater than the breakdown field strength is formed at these areas of contact.

BRIEF DESCRIPTION OF THE DRAWINGS

The invention will now be described in greater detail by way of example, with reference to the drawings in which.

DESCRIPTION OF THE PREFERRED EMBODIMENTS

Figure 1:
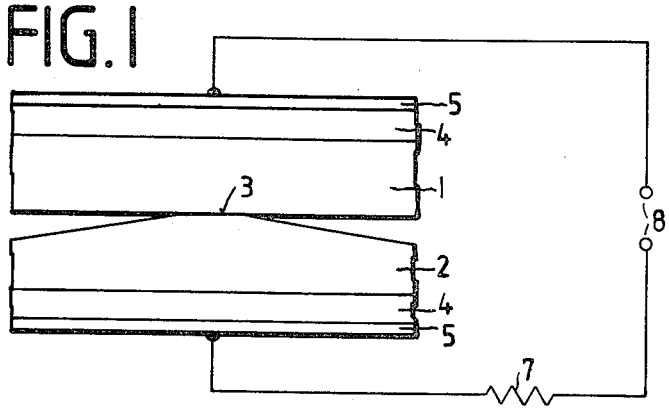
FIG. 1 is a schematic view of one form of the invention.

Basically the invention proposes in a preferred embodiment thereof, to provide two separate semiconductor elements having the same conductivity characteristics, the two semiconductor elements being provided under mechanical pressure with at least three fixed areas of contact having a diameter of less than $1.10^{-2}$ cm. An electrical d.c. or a.c. voltage is applied to the two separate semiconductor elements, which voltage is so high that an electrical field strength greater than the breakdown field strength is formed at these areas of contact.

The areas of contact are preferably equal in area and have an extremely clean surface.

The two semiconductor elements are monocrystalline in accordance with a preferred refinement of the invention and the areas of contact are transformed into monocrystalline narrow path resistors under pressure at an elevated temperature.

The electrical resistance $R_E$ of such a narrow path resistor as is known $R_E = \rho/2D$. Where $\rho$ is the specific electrical resistance of the material in the narrow path resistor and 2D is the diameter of the narrow path resistor. The current is $I = (U \times 2D/\rho)$ as a function of the voltage U lying across the narrow path resistor. The current density $S = (U/\rho 2D)\{Ampere/CM2\}$ rises in the narrow path resistor as the diameter 2D decreases. Since the electrical field strength $|E| = (Volt/cm)$ in a conductor $|E| = S. \rho, |E| = (U/2D)$ may be considered the electrical field strength in a narrow path resistor. From this relationship it may be deduced that, even at relatively small voltages of 100 volts for example, and with diameters of less than $10^{-3}$ cm, field strength in a narrow path of $|E| \approx 10^5 \{Volt/cm\}$ may be achieved. However this is not generally possible because generally an impermissibly large heating of the narrow path resistor is caused by applying a voltage of 100 volts. As is known the excess temperature $\Delta T$ in a narrow path resistor is described in a first approximation by the relationship $\Delta T = (U^2/8\rho\lambda)$. Here U is the voltage across the narrow path resistor and $\lambda$ is the specific heat conductivity. If a demand is made for the over temperature $\Delta T$ to amount to a maximum of 10°, then the voltage U for the heat conductivity of silicon is restricted to $U \leq 0.2$ volt at a specific electrical resistance $\rho = 10^{-3} \Omega$ cm, and is restricted to approximately 6 volts where $\rho = 1\Omega$ cm and to 30 to 100 volts where $\rho = 10^2 - 10^3 \Omega$ cm. If it is possible to keep within the framework of these voltages approximately and nevertheless—by means of a correspondingly small diameter 2D of the limit resistor—to increase the electrical field strength up to breakdown, then this breakdown may be allowed to take place as a purely electrical occurrence with the aid of current limitation by a suitable series resistance.

A preferred practical embodiment of the arrangement in accordance with the invention provides for the two separate semiconductor elements to take the form of plates or discs which are structured on one side in each case so that they have a uniform arrangement of parallel ridges which are separated from each other by means of grooves. The two plates or discs are pressed together under pressure and at an elevated temperature with their structured surfaces facing and their ridges rotated with respect to each other so that the touching ridges cross and form a distribution, in terms of area, of numerous electrically parallel connected narrow path resistors between the two plates or discs.

The principle of crossing parallel ridges has already been described in German Offenlegungsschrift No. P25 47 262. However no reference to a negative semiconductor resistance is to be found here.

The two semiconductor elements preferably comprise monocrystalline (single) element or compound semiconductors with n,p or intrinsic conductivity.

The negative semiconductor resistance may be used advantageously as a saw tooth generator. It is operated with a resistive series impedance which is preferably lower in resistance than the entire resistance of all of the parallel connected narrow path resistors outside the electrical breakdown.

Several negative semiconductor resistors may also be connected electrically in series.

The two separate semiconductor elements have ohmic contacts for the outer electrical connection.

The semiconductor elements may be so constructed that their bulk resistance may be used simultaneously as an ohmic series resistance.

An electrical capacitor may be connected electrically in parallel with the negative semiconductor resistance.

The resistive series impedances and the parallel connected capacitor may be variable.

The negative semiconductor resistance of the invention may be used advantageously also as a switch.

Referring now to the drawings three embodiments of the invention will be described in the following:

Embodiment 1 is an individual semiconductor limit resistor.

Embodiment 2 is a semiconductor resistor having a plurality of parallel limit resistors Embodiment 3 is a negative semiconductor resistor as a saw tooth generator.

Embodiment 1

Figure 3:
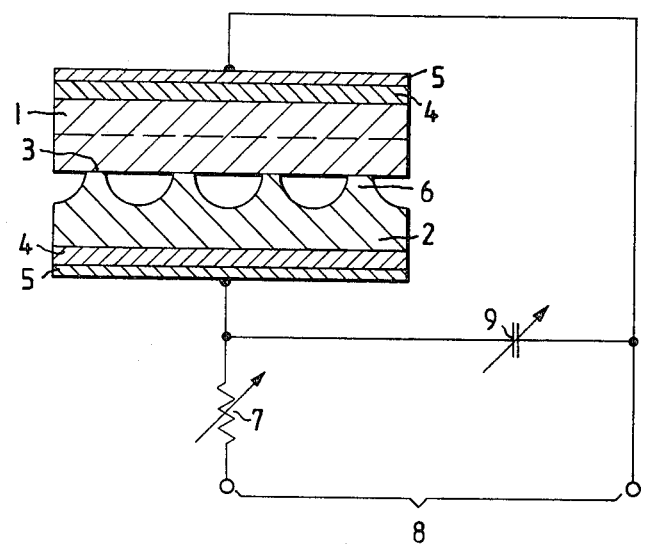

In FIG. 1, 1 and 3 are two separate semiconductor elements with the same conductivity characteristics.

A small area of contact of the two semiconductor elements is shown at 3. This area of contact is determined by the surface of a ridge-or-mesa-shaped elevation on the disc-shaped semiconductor element 2. Highly doped semiconductor layers 4 are provided on the two semiconductor elements on their surfaces remote from the area of contact while the type of conductivity of these layers corresponds to that of the semiconductor elements. Metal contacts 5 are arranged on the highly doped semiconductor layers. The two metal contacts are connected to the voltage source 8 via a series resistance 7.

Embodiment 2

Figure 2A:
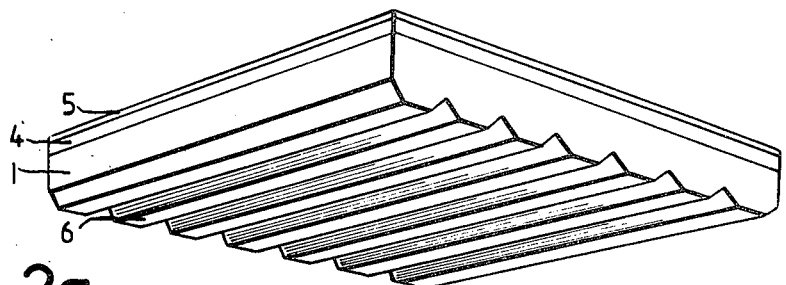
FIG. 2 a is a perspective view of two semiconductor elements used in the construction of a second form of resistance in accordance with the invention.
FIG. 2b is a sectional view of the contact areas of the semiconductor elements shown in FIG. 2a, and FIG. 3 is a side view with a schematic circuit of a semiconductor resistor in accordance with the invention as a saw tooth generator.
Figure 2B:
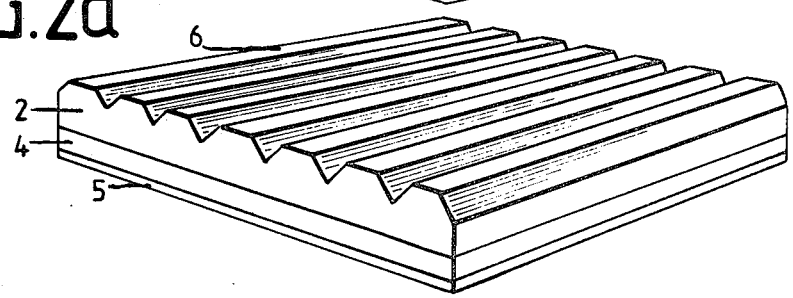

In FIG. 2a, the two semiconductor elements 1 and 2 take the shape of monocrystalline silicon plates which have a structure of parallel ridges 6 with intermediate grooves on one of their two sides. Highly-doped semiconductor layers 4 are provided on the surfaces opposite to the structured surfaces and metal contacts 5 are located on these highly doped layers. The plate 1 is placed onto the disc 2 with its ridges rotated in the plane of the discs by an angle of 90° in relation to the ridges of the plate 2. Thus the ridges 6 cross and touch. The areas of contact 3 (see the view of the plane of contact in accordance with FIG. 2b) are converted into monocrystalline narrow path resistors by pressure and an elevated temperature.

Embodiment 3

Figure 2B:
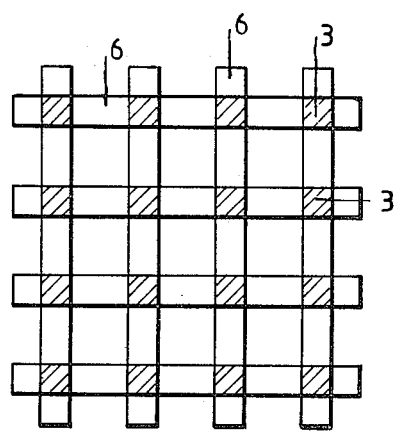

In the sectional view of FIG. 3, 1 and 2 are two monocrystalline 1.000 $\Omega$ cm n-silicon plates with an area of $0.5 \times 0.5$ cm$^2$ which are non rectifying contact via n$^+$-layers 4 and metal contacts 5. Both plates have a thickness of 0.1 cm and carry a structure of parallel ridges 6 on one of their surfaces which ridges have a spacing of $5 \cdot 10^3$ cm. At the narrowest point, coinciding with the outer face, the ridges 6 have a width of only $5 \cdot 10^{-5}$ cm. Both plates are placed against each other under pressure, rotated in the same plane in relation to each other so that the ridge structures cross and touch. The crossing ridges 6 form $4 \cdot 10^4$ areas of contact 3 which are converted at an elevated temperature into monocrystalline limit resistors 3. Each limit resistor 3 has a resistance of approximately $4 \cdot 10^7$ Ohm. The entire arrangement has a resistance of approximately $10^3$ Ohm. A d.c. voltage source 8 may be connected to the non rectifying contact 5 of the negative semiconductor resistance at more 100 volt via the series resistance 7 also having a value of $10^3$ Ohm. If the voltage at the capacitor 9, which is connected in parallel with the negative resistance, reaches the value of 100 volts then an electrical field strength of greater than $10^5$ volt/cm (in the silicon) is present at the narrow path resistors 3 and the resistance of the narrow path resistors 3 collapses so that the capacitor 9 is able to discharge. Of the total power consumption of the arrangement approximately 10 watts, almost 50% is converted into the power of the saw-tooth oscillation. The product of the series resistance 7 and the capacitor 9 is decisive for the frequency of the saw-tooth oscillation. Thus the series resistance 7 and the capacitor 9 are preferably variable in their electrical values.

It will be understood that the above description of the present invention is susceptible to various modification changes and adaptations.

What is claimed is:

1. A negative semiconductor resistance in which two separate semiconductor elements are provided having the same conductivity characteristics; both semiconductor elements have at least three fixed areas of contact with a diameter of less than $1 \cdot 10^{-2}$ under mechanical pressure; and an electrical d.c. or a.c. voltage is applied to the two separate semiconductor elements and is so high that an electrical field strength greater than the breakdown field strength is formed at these areas of contact.

2. A negative semiconductor resistance as defined in claim 1, wherein said areas of contact comprise equal areas.

3. A negative semiconductor resistance as defined in claim 1, wherein said semiconductor elements are monocrystalline and said areas of contact are transformed under pressure into monocrystalline narrow path resistors at an elevated temperature.

4. A negative semiconductor resistance as defined in claim 1, wherein said two separate semiconductor elements comprise plates or discs each structured on one side to provide a uniform arrangement of parallel ridges with said two structured sides having a clean semiconductor surface being pressed together under pressure and at an elevated temperature so that the crossing and touching ridges form a distribution of electrically parallel connected narrow path resistors between said two plates or discs.

5. A negative semiconductor resistance as defined in claim 1, wherein said two semiconductor elements comprise monocrystalline (single) elements or compound semiconductors having n, p or intrinsic conductivity.

6. A negative semiconductor resistance as defined in claim 1, and comprising an ohmic series resistor connected to said negative semiconductor resistance and of a value smaller than the overall resistance of all of the parallel connected narrow path resistors except for electrical breakdown.

7. A negative semiconductor resistance as defined in claim 1, and comprising ohmic connection contacts for said two separate semiconductor elements.

8. A negative semiconductor resistor as defined in claim 1, wherein said two separate semiconductor elements are so thick that their bulk resistance forms the ohmic series resistance.

9. A negative semiconductor resistance as defined in claim 1, and comprising an electrical capacitor connected in parallel with the negative semiconductor resistance.

10. A negative semiconductor resistance as defined in claim 9, wherein the electrical values of said negative semiconductor resistance and said parallel capacitor are variable.

11. A negative semiconductor resistance as defined in claim 1, and comprising several negative semiconductor resistances connected electrically in series.

12. A negative semiconductor resistance comprising two separate semiconductor elements of the same conductivity characteristics and defining between them at least three fixed areas of contact with a diameter of less than $1 \cdot 10^{-2}$ cm and means for applying a voltage to said two separate semiconductor elements to provide an electrical field strength greater than the breakdown field strength at said areas of contact.

* * * * *